(12) United States Patent
Wang et al.

(10) Patent No.: US 9,755,175 B2
(45) Date of Patent: Sep. 5, 2017

(54) OLED DISPLAY PANEL, METHOD FOR MANUFACTURING THE SAME AND DISPLAY APPARATUS

(71) Applicant: BOE Technology Group Co., Ltd., Beijing (CN)

(72) Inventors: Shang Wang, Beijing (CN); Wei Qin, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 179 days.

(21) Appl. No.: 14/436,623

(22) PCT Filed: Aug. 26, 2014

(86) PCT No.: PCT/CN2014/085169
§ 371 (c)(1),
(2) Date: Apr. 17, 2015

(87) PCT Pub. No.: WO2015/131503
PCT Pub. Date: Sep. 11, 2015

(65) Prior Publication Data
US 2016/0301027 A1    Oct. 13, 2016

(30) Foreign Application Priority Data

Mar. 5, 2014    (CN) .......................... 2014 1 0078901

(51) Int. Cl.
*H01L 29/08*    (2006.01)
*H01L 51/50*    (2006.01)
(Continued)

(52) U.S. Cl.
CPC ....... *H01L 51/5044* (2013.01); *G09G 3/3225* (2013.01); *G09G 3/3275* (2013.01);
(Continued)

(58) Field of Classification Search
CPC ................................................... H01L 51/5044
(Continued)

(56) References Cited

U.S. PATENT DOCUMENTS 6,368,730 B1 *    4/2002    Kishimoto ........... H01L 51/5206
                                                            313/502
2004/0113550 A1    6/2004    Adachi et al.
(Continued)

FOREIGN PATENT DOCUMENTS

CN    101601079 A    12/2009
CN    103855193 A    6/2014
(Continued)

OTHER PUBLICATIONS

Office Action for Chinese Patent Application No. 201410078901.2, dated May 5, 2016, 13 pages.
(Continued)

*Primary Examiner* — Ajay K Arora
(74) *Attorney, Agent, or Firm* — Westman, Champlin & Koehler, P.A.

(57) ABSTRACT

Disclosed is an OLED display panel, a method for manufacturing the same, and a display apparatus. The OLED display panel comprises a substrate and a light emitting structure including a plurality of sets of light emitting units sequentially arranged on the substrate side by side, each set of light emitting units including a first light emitting unit, a second light emitting unit and a third light emitting unit. In each set of light emitting units, at least two of the first, second and third light emitting units are located in different layers. The OLED display panel and the display apparatus can reduce signal attenuation and crosstalk between different signals.

11 Claims, 4 Drawing Sheets

(51) Int. Cl.
*H01L 25/04* (2014.01)
*H01L 27/32* (2006.01)
*G09G 3/3225* (2016.01)
*G09G 3/3275* (2016.01)
*H01L 51/56* (2006.01)
*H01L 51/52* (2006.01)

(52) U.S. Cl.
CPC ........ *H01L 25/048* (2013.01); *H01L 27/3211* (2013.01); *H01L 27/3244* (2013.01); *H01L 51/525* (2013.01); *H01L 51/5246* (2013.01); *H01L 51/5271* (2013.01); *H01L 51/56* (2013.01); *G09G 2310/08* (2013.01); *G09G 2320/0209* (2013.01); *G09G 2320/0626* (2013.01); *H01L 51/524* (2013.01); *H01L 2227/323* (2013.01); *H01L 2924/0002* (2013.01)

(58) Field of Classification Search
USPC .......................................................... 257/40
See application file for complete search history.

(56) References Cited

U.S. PATENT DOCUMENTS

2005/0174044 A1   8/2005   Miura
2008/0137008 A1*  6/2008   Rogojevic ......... G02F 1/133603
                                                    349/69

FOREIGN PATENT DOCUMENTS

| JP | 07-114350 A | 5/1995 |
| JP | 2005-71693 A | 3/2005 |
| JP | 2009-246402 A | 10/2009 |

OTHER PUBLICATIONS

Office Action, including Search Report, for Chinese Patent Application No. 201410078901.2, dated Dec. 3, 2015, 15 pages.
International Search Report and Written Opinion for PCT Application No. PCT/CN2014/085169, dated Dec. 12, 2014, 12 pages.

* cited by examiner

OLED DISPLAY PANEL, METHOD FOR MANUFACTURING THE SAME AND DISPLAY APPARATUS

CROSS-REFERENCE TO RELATED APPLICATION

This Application is a Section 371 National Stage Application of International Application No. PCT/CN2014/85169, filed Aug. 26, 2014, which has not yet published, which claims priority to Chinese Patent Application No. 201410078901.2, filed Mar. 5, 2014, in Chinese, the contents of which are hereby incorporated by reference in their entirety.

BACKGROUND OF THE INVENTION

Field of the Invention

Embodiments of the present invention generally relate to field of display technique, in particular, to an Organic Light Emitting Diode (OLED) display panel, a method for manufacturing the same and a display apparatus.

Description of the Related Art

An Organic Light Emitting Diode (OLED) has been widely used in a display apparatus due to its rapid response, brilliant color, lightweight and convenience, wide operating range and the like. However, for a large-size display panel, high resolution thereof would result in a too large loading of a driving circuit for driving the display panel, which may lead to serious signal attenuation. When a signal is attenuated to a certain extent, distortion of images would occur, thus affecting display effect.

The loading of the driving circuit mainly depends on resistances and capacitances. Contribution of the resistances to the loading of the driving circuit is mainly from materials and width of lines. Based on limits to the existing technology, both the materials and width of the lines are determined as factors in generation of the loading. Contribution of the capacitances to the loading of the driving circuit is from a coupling capacitance between the lines or between the lines and electrodes, in particular, from a direct overlapping between a gate line and a data line. The more the overlapping portions, the greater the coupling capacitance is, which may result in greater signal attenuation. In addition, due to the generation of the coupling capacitance, a crosstalk would be generated between different signals, thus impacting a display effect.

Specifically, as shown in FIG. 1, an OLED display panel in the prior art may comprises a substrate 10, a packaging substrate 30 and a light emitting structure 50 located between the substrate 10 and the packaging substrate 30. The light emitting structure 50 includes a plurality of first light emitting units 501, a plurality of second light emitting units 502 and a plurality of third light emitting units 503 which are disposed in the same layer and alternatively arranged in a direction parallel to the substrate 10 periodically. Based on this structure, both a thin film transistor and a circuit structure corresponding to each the light emitting unit are disposed on the substrate 10. Thus, the greater coupling capacitance may be generated between the overlapped lines, for example, between a gate line and a data line of the thin film transistor, thereby resulting in the signal attenuation. At the same time, the generation of the coupling capacitance would result in the crosstalk between the different signals, thereby impacting the display effect.

SUMMARY OF THE INVENTION

In order to overcome or alleviate at least one aspect of the above mentioned disadvantages, embodiments of the present invention provides an OLED display panel, a method for manufacturing the same and a display apparatus, which may reduce signal attenuation and crosstalk between different signals.

According to an aspect of embodiments of the present invention, there is provided an OLED display panel comprising a substrate; and a light emitting structure including a plurality of sets of light emitting units sequentially arranged on the substrate side by side, each set of light emitting units including a first light emitting unit, a second light emitting unit and a third light emitting unit, wherein, in each set of light emitting units, at least two of the first, second and third light emitting units are located in different layers.

The OLED display panel as described above further comprises a transparent substrate disposed above the substrate, and the second and third light emitting units are disposed between the substrate and the transparent substrate.

In the OLED display panel as described above, the second light emitting unit is disposed in the same layer as the third light emitting unit in a thickness direction between the transparent substrate and the substrate.

In the OLED display panel as described above, the second light emitting unit is disposed in a different layer from the third light emitting unit in a thickness direction between the transparent substrate and the substrate.

The OLED display panel as described above further comprises a support structure disposed between the substrate and the transparent substrate and being in contact with both the substrate and the transparent substrate, the support structure is disposed to be aligned with the first light emitting unit in a thickness direction.

In the OLED display panel as described above, a surface of the support structure is covered with a material having light reflecting characteristic.

In the OLED display panel as described above, the support structure has a truncated pyramid structure, and an area of a surface of the support structure contacting with the transparent substrate is smaller than that of a surface of the support structures contacting with the substrate.

The OLED display panel as described above further comprises a transparent substrate disposed above the substrate, the first and second light emitting units are disposed on a surface of the transparent substrate facing away from the substrate, and the third light emitting unit is disposed between the substrate and the transparent substrate.

In the OLED display panel as described above, each the light emitting unit has a main light emitting region and a dim region located around the main light emitting region, and the dim regions of any two adjacent light emitting units located in different layers are overlapped with each other.

In the OLED display panel as described above, in the plurality of sets of the light units, gaps between the adjacent first light emitting units, between the adjacent second light emitting units, and between the adjacent third light emitting units are filled with transparent resins, respectively.

According to another aspect of embodiments of the present invention, there is provided a display apparatus comprising the OLED display panel as described above and a driving device configured to drive the first light emitting unit, the second light emitting unit and the third light emitting unit to emit lights, respectively.

According to another aspect of embodiments of the present invention, there is provided a method for manufacturing an OLED display panel comprising steps of: providing a transparent substrate and a substrate; forming a plurality of spaced first light emitting units on a first side of the transparent substrate; forming a plurality of spaced second light emitting units on the first side, a second side of the transparent substrate or the substrate; forming a plurality of spaced third light emitting units on the substrate; assembling the substrate with the transparent substrate together, so that the first light emitting units are located on one side of the transparent substrate facing away from the substrate, the third light emitting units are located between the substrate and the transparent substrate, and the first light emitting unit, the second light emitting unit and the third light emitting unit of each set of light emitting units are sequentially arranged in a direction parallel to the substrate.

In the OLED display panel, the method for manufacturing the same and the display apparatus according to the embodiments of the present invention, it is possible to incompletely provide the film transistor and the circuit structure corresponding to each of the light emitting units in the same layer by incompletely providing the first light emitting unit, the second light emitting unit and the third light emitting unit of each set of light emitting units in the same layer. In this way, it is possible to effectively reduce overlapping between lines corresponding to three different light emitting units of each set of light emitting units.

Specifically, the circuit structure corresponding to the first light emitting unit may only include a gate line for controlling each row and a data line for controlling the first light emitting unit, the circuit structure corresponding to the second light emitting unit may only include a gate line for controlling each row and a data line for controlling the second light emitting unit, and the circuit structure corresponding to the third light emitting unit 503 may only include a gate line for controlling each row and a data line for controlling the third light emitting unit. Since the film transistors and the circuit structures respectively corresponding the first light emitting unit, the second light emitting unit and the third light emitting unit are incompletely disposed in the same layer, the OLED display panel according to the embodiments of the present invention may effectively reduce the overlapping between the lines, for example, between the gate line and the data line of the thin film transistor, thereby reducing coupling capacitance and signal attenuation. At the same time, it is also possible to reduce crosstalk between different signals, thereby improving display effect.

BRIEF DESCRIPTION OF THE DRAWINGS

The above and other features of the present invention will become more apparent by describing in detail exemplary embodiments thereof with reference to the accompanying drawings, in which:

FIG. 9 (9) is a principle block diagram of a screen scanning circuit applied on the OLED display panel in the prior art.

DETAILED DESCRIPTION OF PREFERRED EMBODIMENTS OF THE INVENTION

In order to completely understand the technical solution of the present invention, exemplary embodiments of the present disclosure will be described hereinafter in detail with reference to the attached drawings. Obviously, the described embodiments are merely part of the embodiments of the present invention, rather than all of the embodiments of the present invention. Based on the embodiments of the present invention, other embodiments acquired by the person skilled in the art without any inventive effort will be within the protection scope of the present invention.

In addition, in the below detail description, for easy to explain, many specific details are set forth to provide a complete understanding to the disclosure. However, one or more embodiments can be obviously implemented without these specific details. In other cases, well-known structures and devices are illustrated to simplify the drawings.

According to the general inventive concept of the present invention, there is provided an Organic Light Emitting Diode (OLED) display panel comprising a substrate and a light emitting structure. The light emitting structure includes a plurality of sets of light emitting units sequentially arranged on the substrate side by side. Each set of light emitting units includes a first light emitting unit, a second light emitting unit and a third light emitting unit. In each set of light emitting units, at least two of the first, second third light emitting units are located in different layers.

Figure 1:
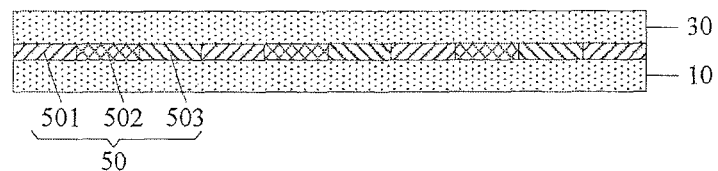
FIG. 1 is a partial cross-section view of an OLED display panel in the prior art.
Figure 2:
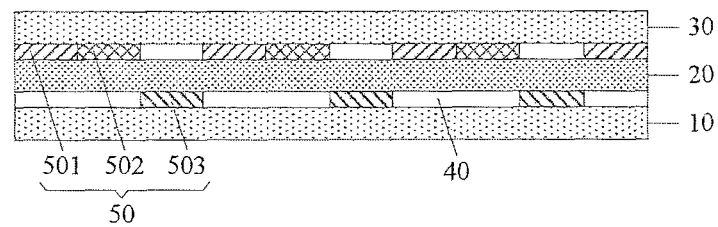
FIG. 2 is a partial cross-section view of an OLED display panel according to a first exemplary embodiment of the present invention.
Figure 3:
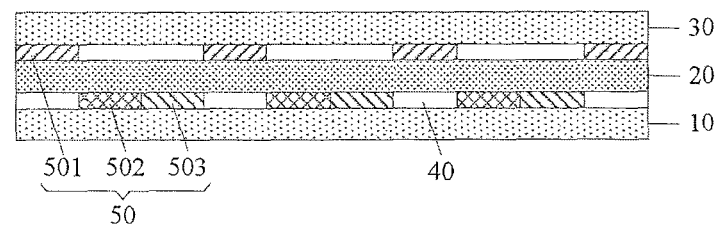
FIG. 3 is a partial cross-section view of an OLED display panel according to a second exemplary embodiment of the present invention.
Figure 4:
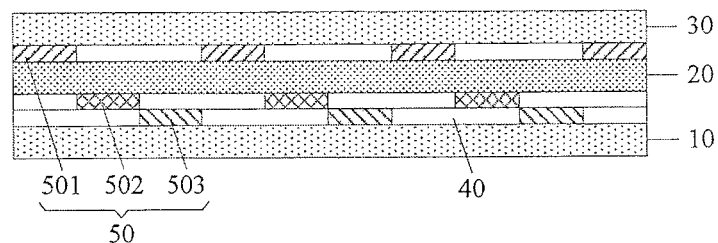
FIG. 4 is a partial cross-section view of an OLED display panel according to a third exemplary embodiment of the present invention.

FIGS. 2 to 4 is partial cross-section views of OLED display panels according to exemplary embodiments of the present invention. As shown in FIGS. 2 to 4, the OLED display panel comprises a substrate 10 and a light emitting structure 50. The light emitting structure 50 includes a plurality of sets of light emitting units sequentially arranged on the substrate 10 side by side in a direction parallel thereto. Each set of light emitting units includes a first light emitting unit 501, a second light emitting unit 502 and a third light emitting unit 503. In each set of light emitting units, at least two of the first light emitting unit 501, the second light emitting unit 502 and the third light emitting unit 503 are located in different layers. That is, the light emitting structure 50 includes a plurality of spaced first light emitting unit 501, a plurality of spaced second light emitting unit 502 and a plurality of spaced third light emitting unit 503. One first light emitting unit 501, one second light emitting unit 502 and one third light emitting unit 503 are sequentially arranged to form one set of light emitting units so that the plurality of first light emitting units 501, the plurality of second light emitting units 502 and the plurality of third light emitting units 503 are periodically arranged.

In the OLED display panel according to the embodiments of the present invention, since at least two of the first light emitting unit 501, the second light emitting unit 502 and the third light emitting unit 503 are located in different layers, a gap is necessarily formed between the adjacent first light emitting units 501, between the adjacent second light emitting units 502 as well as between the adjacent third light emitting units 503, respectively. In order to ensure flatness and water and oxygen resistance of the OLED display panel, the gap between the plurality of light emitting units are needed to be filled, and a filling material should be transparent.

In the plurality of sets of light emitting units, the first light emitting unit 501, the second light emitting unit 502 and the third light emitting unit 503 are arranged in a periodical array. The first light emitting unit 501, the second light emitting unit 502 and the third light emitting unit 503 may be in correspondence to one of a red light emitting unit, a green light emitting unit and a blue light emitting unit respectively, and their specific corresponding relationships are not limited herein.

Figure 5:
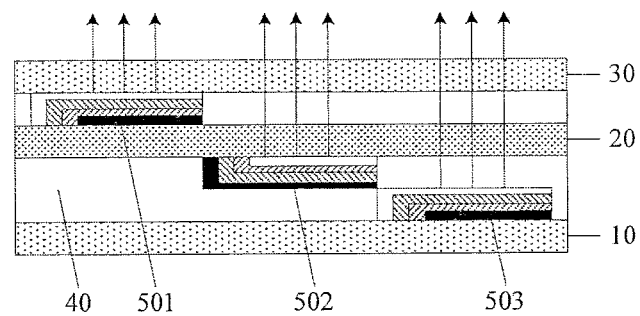
FIG. 5 is a partial cross-section view of a set of light-emitting units of the OLED display panel as shown in FIG. 4 according to an exemplary embodiment.

At least two of the first light emitting unit 501, the second light emitting unit 502 and the third light emitting unit 503 of each set of light emitting units are located in different layers, as illustrated in FIG. 5, each layer may include a cathode and an anode for forming a complete light emitting unit, and a light emitting member located between the cathode and the anode.

The OLED display panel of the embodiments of the present invention may comprise a plurality of pixel units arranged in an array, each of which corresponds to the plurality of sets of light emitting units. In this way, a thin film transistor and a circuit structure corresponding to each the light emitting unit may be disposed between each light emitting unit and a back panel. Here, the back panel refers to a substrate for providing the thin film transistor and the circuit structure thereon. For example, in the case as shown in FIG. 2, the thin film transistor corresponding to the first light emitting unit 501 and the thin film transistor corresponding to the second light emitting unit 502 may be disposed between the corresponding light emitting unit and a transparent substrate 20, and the thin film transistor corresponding to the third light emitting unit 503 may be disposed between the third light emitting unit 503 and the substrate 10.

In the OLED display panel according to the embodiments of the present invention, all of light paths of the first light emitting unit 501, the second light emitting unit 502 and the third light emitting unit 503 may be provided as a top-emitting or a bottom-emitting type. Of course, the light paths may be provided as a double-side-emitting type. Accordingly, the specific light path of each light emitting unit should be determined according to the actual type of the OLED display panel and the specific position of each light emitting unit. The top-emitting type means that a light emitting direction directs away from the back panel side, and the bottom emitting type means that the light emitting direction directs toward the back panel side, and the double-side emitting type means that the light emitting direction includes two directions which are the light emitting direction directing away from the back panel side and the light emitting direction directing toward the back panel side.

In the OLED display panel according to the embodiments of the present invention, it is possible to incompletely (or partly) provide the film transistor and the circuit structure corresponding to each set of light emitting units in the same layer by incompletely providing the first light emitting unit 501, the second light emitting unit 502 and the third light emitting unit 503 of each set of light emitting units in the same layer. In this way, it is possible to effectively reduce overlapping between lines corresponding to three different light emitting units of each set of light emitting units. Specifically, the circuit structure corresponding to the first light emitting unit 501 may only include a gate line for controlling each row and a data line for controlling the first light emitting unit 501, the circuit structure corresponding to the second light emitting unit 502 may only include a gate line for controlling each row and a data line for controlling the second light emitting unit 502, and the circuit structure corresponding to the third light emitting unit 503 may only include a gate line for controlling each row and a data line for controlling the third light emitting unit 503. Since the film transistors and the circuit structures respectively corresponding the first light emitting unit, the second light emitting unit and the third light emitting unit are incompletely disposed in the same layer, the OLED display panel according to the embodiments of the present invention may effectively reduce the overlapping between the lines, for example, between the gate line and the data line of the thin film transistor, thereby reducing coupling capacitance and signal attenuation. At the same time, it is also possible to reduce crosstalk between different signals, thereby improving display effect.

FIG. 2 is a partial cross-section view of an OLED display panel according to a first exemplary embodiment of the present invention. Referring to FIG. 2, the OLED display panel further comprises a transparent substrate 20 disposed above the substrate 10. The first light emitting unit 501 and the second light emitting unit 502 are disposed on a surface on one side of the transparent substrate 20 facing away from the substrate 10 and are adjacent to each other, and the third light emitting unit 503 is disposed between the substrate 10 and the transparent substrate 20.

OLED display panels according to second and third exemplary embodiments of the present invention as shown in FIGS. 3 and 4 may comprise a transparent substrate 20 disposed above the substrate 10. In each set of light emitting units, a first light emitting unit 501 is disposed on a surface on one side of the transparent substrate 20 facing away from the substrate 10, a second light emitting unit 502 and a third light emitting unit 503 are disposed between the substrate 10 and the transparent substrate 20. More particularly, in the embodiment as shown in FIG. 3, the second light emitting unit 502 and the third light emitting unit 503 are disposed on the same layer in a thickness direction between the substrate 10 and the transparent substrate 20. In the embodiment as shown in FIG. 4, the second light emitting unit 502 is disposed on a different layer from the third light emitting unit 503 in the thickness direction between the substrate 10 and the transparent substrate 20.

In various embodiments as described above, both the substrate 10 and the transparent substrate 20 may be made of glass or flexible materials to support the light emitting units and circuits thereof.

Specifically, when the light emitting unit is disposed on the substrate 10, the thin film transistor and the circuit structure corresponding to the light emitting unit may be disposed between the light emitting unit and the substrate 10. In this case, the substrate 10 is used as the back panel of the light emitting unit. When the light emitting unit is disposed on the transparent substrate 20, the thin film transistor and the circuit structure corresponding to the light emitting unit may be disposed between the light emitting unit and the transparent substrate 20. In this case, the transparent substrate 20 is used as the back panel of the light emitting unit.

According to the embodiments of the present invention, the second light emitting unit 502 may be disposed on the substrate 10 or the transparent substrate 20. Specifically, as illustrated in FIG. 3, the second light emitting units 502 may be disposed on the substrate 10. As illustrated in FIG. 4, the second light emitting units 502 may be disposed on the surface on the one side of the transparent substrate 20 facing with the substrate 10. As shown in FIG. 2, the second light emitting units 502 may be disposed on the surface on the one side of the transparent substrate 20 facing away from the substrate 10.

Therefore, in the OLED display panel according to the embodiments of the present invention, the thin film transistors and circuit structures corresponding to different light emitting units may be disposed on the back panels which are not identical, so that the overlapping between lines, for example, between the gate line and the data line of the thin film transistor, on the same back panel may be reduced in a certain extent to reduce the coupling capacitance, thereby reducing the signal attenuation. At the same time, it is also possible to reduce the crosstalk between the different signals.

In the OLED display panel as shown in FIG. 4, the thin film transistor and the circuit structure corresponding to the first light emitting unit 501 may be disposed between the first light emitting unit 501 and the transparent substrate 20, i.e., on an upper surface of the transparent substrate 20. The thin film transistor and the circuit structure corresponding to the second light emitting unit 502 may be disposed between the second light emitting units 502 and the transparent substrate 20, i.e., on a lower surface of the transparent substrate 20. The thin film transistor and the circuit structure corresponding to the third light emitting units 503 may be disposed between the third light emitting units 503 and the substrate 10, i.e., on an upper surface of the substrate 10.

In this way, the thin film transistors and the circuit structures corresponding to the first light emitting unit 501, the second light emitting unit 502 and the third light emitting unit 503 may be located in different back panels respectively, so that the coupling capacitance among the lines thereof will be significantly reduced, thereby significantly reducing the signal attenuation while reducing the crosstalk between the different signals.

Figure 6:
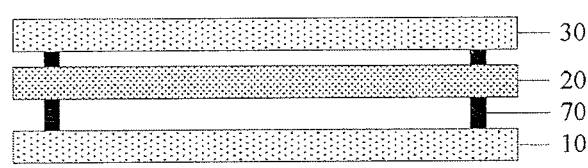
FIG. 6 is a partial cross-section view of an OLED display apparatus according to an exemplary embodiment of the present invention.

Considering actual application of the display panel, as illustrated in FIG. 6, the OLED display panel may further comprise a package substrate 30 disposed opposite to the substrate 10. The package substrate 30 and the substrate 10 are cooperated to form a frame of the OLED display panel. Further, frame sealing adhesives 70 are disposed between the substrate 10 and the package substrate 30 as well as between the transparent substrate 20 and the package substrate 30.

In this case, light transmission of the substrate 10 and the package substrate 30 may be determined according to the specific type of the OLED display panel. For example, when the OLED display panel is provided as a single-side light emitting display panel, the substrate, such as the package substrate 30 or the substrate 10, located on a light emitting side should have a good light transmission. In this case, the light paths of the first light emitting unit 501, the second light emitting unit 502 and the third light emitting unit 503 may be correspondingly set as the top-emitting type or the bottom-emitting type. In another case, when the OLED display panel is provided as a double-side light emitting display panel, both the substrates, such as the package substrate 30 and the substrate 10, located on both sides should have good light transmissions. In this case, the light paths of the first light emitting unit 501, the second light emitting unit 502 and the third light emitting unit 503 may be correspondingly set as the double-side-emitting type.

Figure 7:
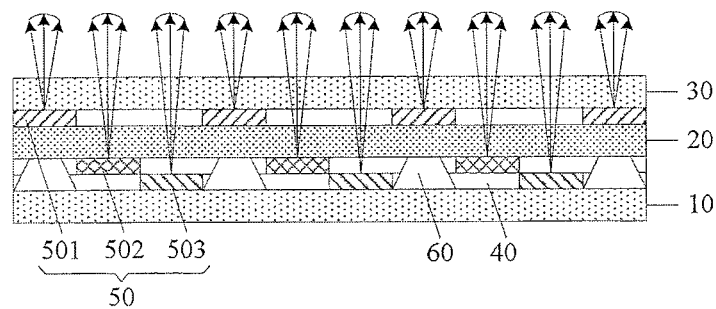
FIG. 7 is a partial cross-section view of an OLED display panel according to a fourth exemplary embodiment of the present invention.

An OLED display panel according to a fourth exemplary embodiment of the present invention as shown in FIG. 7 is a modification of the OLED display panel according to the third exemplary embodiment of the present invention as shown in FIG. 4. The OLED display panel according to the fourth exemplary embodiment of the present invention may further comprise a support structure 60 disposed between the substrate 10 and the transparent substrate 20 and be in contact with both the substrate 10 and the transparent substrate 20. The support structure 60 may be disposed to be aligned with the first light emitting unit 501 in the thickness direction.

Here, a surface of the support structure 60 is covered with a material having light reflecting characteristic, for example, a metal material such as one of gold, copper, molybdenum.

Further, the support structure 60 may be provided as a truncated pyramid structure, and an area of a surface of the support structure 60 contacting with the transparent substrate 20 (the upper surface in FIG. 7) is smaller than that of a surface of the support structures 60 contacting with the substrate 10 (the lower surface in FIG. 7).

It is possible to ensure the uniform flatness of the OLED display panel by providing the support structure 60 and allowing a thickness of the support structure 60 to be equal to that of the light emitting structure between the transparent substrate 20 and the substrate 10.

Furthermore, since the surface of the support structure 60 is covered with the material having the light reflecting characteristic and the support structure 60 is provided as the truncated pyramid structure, a light emitted from the light emitting unit will be re-emitted through reflection when being incident on the surface of the support structure 60, thereby improving utilization of the light.

In the plurality of sets of light emitting units, since the plurality of first light emitting units 501 are separately arranged with an interval, the plurality of second light emitting units 502 are separately arranged with an interval, the plurality of third light emitting units 503 are separately arranged with an interval, and at least two of first light emitting unit 501, the second light emitting unit 502 and the third emitting unit 503 are located in the different layers, gaps are necessarily formed between the adjacent first light emitting units 501, between the adjacent second light emitting units 502 and between the adjacent third light emitting units 503, respectively. Referring to FIG. 7, the gap between the adjacent first light emitting units 501, between the adjacent second light emitting units 502 and between the adjacent third light emitting units 503 may be filled with a transparent resin 40, respectively.

Here, the transparent resin 40 to be filled may be selected as a transparent resin material such as Polyethylene (PE) having high transparency and water and oxygen resistance. It is possible to improve flatness and water and oxygen resistance of the OLED display panel by filling the transparent resin 40 in the gaps among the plurality of light emitting units.

The light path of the OLED display panel according to the embodiments of the present invention will be described below taken the single-side light emitting OLED display panel as an example. Specifically, referring to FIG. 7, the OLED display panel comprises the substrate 10, the package substrate 30, the transparent substrate located between the substrate 10 and the package substrate 30, a plurality of third light emitting units 503 on the substrate 10, a plurality of second light emitting units 502 disposed on the lower surface of the transparent substrate 20, a plurality of first light emitting units 501 disposed on the upper surface of the transparent substrate 20, the transparent resin 40 filled between the adjacent light emitting units, and the truncated pyramid shaped support structure 60 located between the substrate 10 and the transparent substrate 20. The light emitting side of the OLED display panel is located on one side of the package substrate 30. The package substrate 30 is a transparent glass substrate, and the substrate 10 is an opaque substrate.

In this case, referring to FIG. 5, the first light emitting unit 501 may include a metal reflecting electrode, a polymer conductive layer, a polymer emitting layer and a transparent Indium Tin Oxide (ITO) electrode sequentially disposed on the upper surface of the transparent substrate 20. The second light emitting unit 502 may include a transparent ITO electrode, a polymer emitting layer, a polymer conductive layer and a metal reflecting electrode sequentially disposed on the lower surface of the transparent substrate 20. The third light emitting unit 503 may include a metal reflecting electrode, a polymer conductive layer, a polymer emitting layer and a transparent ITO electrode sequentially disposed on the substrate 10. Therefore, the light path of the first light emitting unit 501 is the top-emitting type, the light path of the second light emitting unit 502 is the bottom-emitting type, and the light path of the third light emitting unit 503 is the top-emitting type.

In this way, the light emitted from the first light emitting unit 501 may directly pass through the package substrate 30 to emit out. The light emitted from the second light emitting unit 502 is emitted close to the lower surface of the transparent substrate 20 and may finally pass through the transparent substrate 20 and the package substrate 30 to emit out. The light emitted from the third light emitting unit 503 may pass through the transparent substrate 20 and the package substrate 30 to emit out. Since the light emitted from each the light emitting unit have a certain angle, when being incident onto a side surface of the support structure 60, the light emitted from the third light emitting unit 503 will be directly reflected to one side of the transparent substrate 20 and finally pass through the transparent substrate 20 and the package substrate 30.

Figure 8:
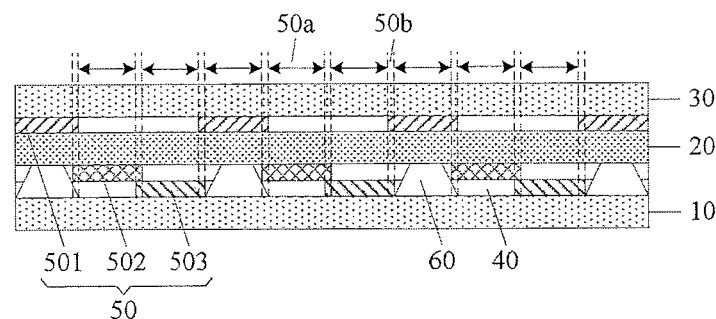
FIG. 8 is a partial cross-section view of an OLED display panel according to a fifth exemplary embodiment of the present invention.

Further, each the light emitting unit may include a main light emitting region 50a and a dim region 50b located around the main light emitting region 50a. The main light emitting region 50a of the light emitting unit having a single pixel is mainly centralized in the middle of the light emitting unit, and a boundary region of the light emitting unit is the dim region 50b which hardly emits lights. A luminous energy of the dim region 50b is much smaller than that of the main light emitting region 50a. Based on this, any two dim regions which are adjacent to each other and located in different layer are overlapped with each other, as illustrated in FIG. 8.

In this way, for the entire OLED display panel, an area of the dim regions will be reduced by overlapping the dim regions of the light emitting units in the different layers with each other. It is possible to effectively increase the number of the pixels per unit, thereby improving resolution of the OLED display panel.

In order to obtain the best resolution, the first light emitting unit 501, the second light emitting unit 502 and the third light emitting unit 503 of the embodiments of the present invention are located in different three layers respectively, so that the area of the dim regions will be reduced to the largest degree, thereby improving the resolution of the OLED display panel.

According to another aspect of embodiments of the present invention, there is provided a display apparatus comprising the OLED display panel according to various embodiments as described above, and a driving device configured to drive the first light emitting unit 501, the second light emitting unit 502 and the third light emitting unit 503 to emit lights, respectively.

Figure 9:
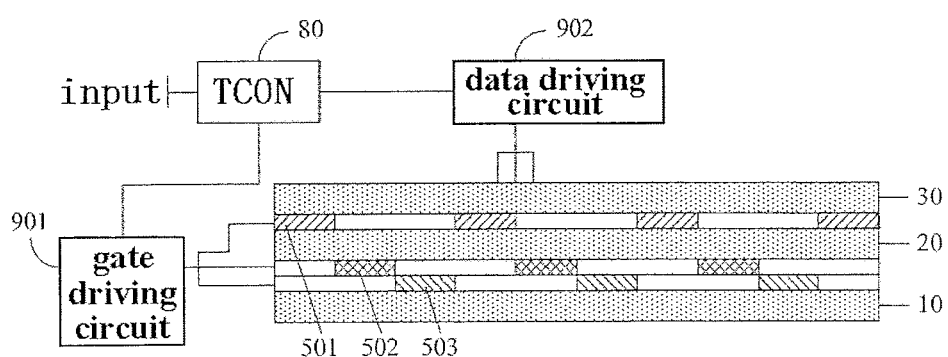
FIG. 9 (a) is a principle block diagram of a screen scanning circuit according to an exemplary embodiment of applied on the OLED display panel of the embodiments of the present invention.
Figure 9:
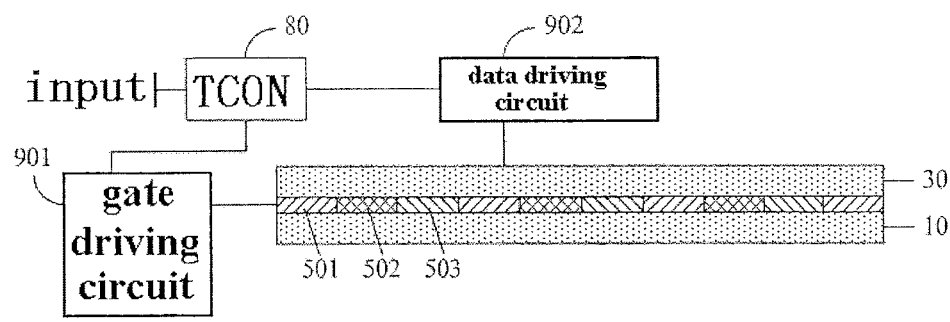

In an exemplary embodiment of the present invention, as shown in FIG. 9(a), the driving device may include a timing controller (TCON) 80, and a driving circuit including a gate driving circuit 901 and a data driving circuit 902. The timing controller 80 is configured for converting a signal output from a signal source into an image data signal and simultaneously generating a timing controlling signal necessary for the gate driving circuit 901 and the data driving circuit 902.

In a conventional OLED display apparatus, as illustrated in FIG. 9(b), since the first light emitting unit 501, the second light emitting unit 502, the third light emitting unit 503 are located on the same layer, the gate driving circuit 901 and the data driving circuit 902 are connected with a gate line and a data line located in the same layer, respectively. In this way, the gate driving circuit 901 and the data driving circuit 902 will simultaneously transmit scanning signals and data signals for different light emitting units. Based on this signal input manner, it is easy to generate mutual interference between different signals.

Referring to FIG. 9(a), in the display apparatus according to the embodiments of the present invention, it is possible to connect the gate driving circuit 901 and the data driving circuit 902 with the gate line and the data line located in different layers respectively by providing a circuit structure for different light emitting units on the different layers. In this way, the gate driving circuit 901 and the data driving circuit 902 will separately transmit the scanning signals and the data signals for different light emitting units, i.e., will independently control thin film transistors and circuit structures in the different layers.

Figure 10:
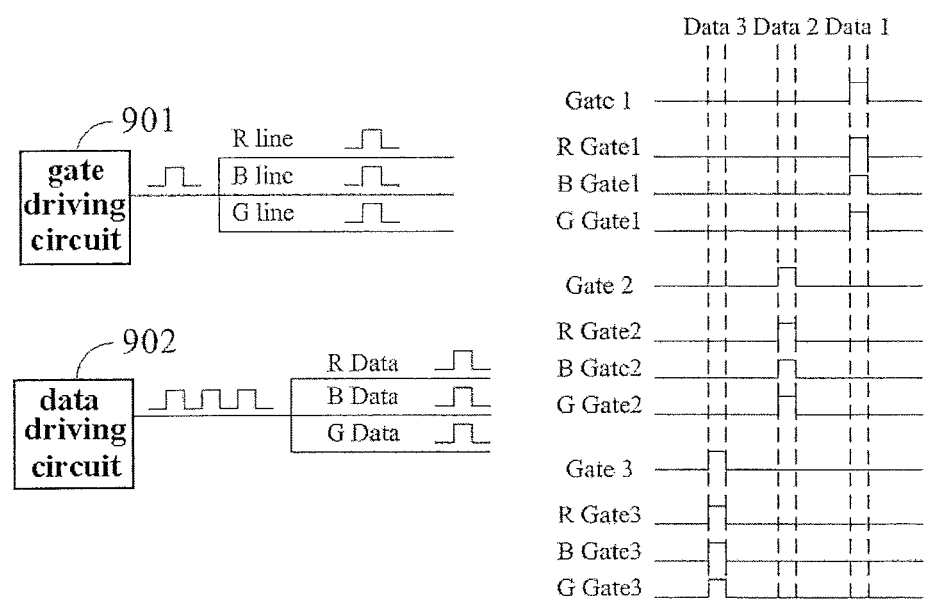
FIG. 10 is a signal input timing diagram of the screen scanning circuit as shown in FIG. 9(a).

In an exemplary embodiment of the present invention, as illustrated in FIG. 10, the gate driving circuit 901 may simultaneously turn on all the thin film transistors in the same thin film transistor row in the different layers, and the data driving circuit 902 may simultaneously input the signals to all the pixel units in different pixel unit columns Specifically, at a first time, the gate electrodes of the thin film transistors located in the same row and in the different layers are simultaneously turned on through inputting the scanning signals to the gate lines located in the same row and in the different layers by the gate driving circuit 901, and then display electrodes corresponding to RGB pixel units respectively may reach desired voltage values and are charged through simultaneously inputting the different signals to the data lines located in different columns by the data driving circuit 901 respectively. The above operations are sequentially repeated at second and third time to realize a continuous image display. In this way, it is possible to effectively avoid the mutual interference between the different signals, thereby improving the display quality.

Referring to FIGS. 2 to 4, embodiments of the present invention further provide a method for manufacturing an OLED display panel comprising steps of: providing a substrate; and forming a light emitting structure, the step of forming a light emitting structure including a step of forming a plurality of sets of light emitting units sequentially arranged on the substrate side by side. Each set of the light emitting units includes a first light emitting unit, a second light emitting unit and a third light emitting unit. In each set of light emitting units, at least two of the first, second third light emitting units are located in different layers.

The step of forming a light emitting structure comprises steps of: forming a plurality of spaced first light emitting units 501 on a first side of a transparent substrate 20; forming a plurality of spaced second light emitting units 502 on the first side, a second side of the transparent substrate 20 or a substrate 10; forming a plurality of spaced third light emitting units 503 on the substrate 10; assembling the substrate 10 with the transparent substrate 20 together, so that the first light emitting units 501 are located on one side of the transparent substrate 20 facing away from the substrate 10, the third light emitting units 503 are located between the substrate 10 and the transparent substrate 20, and the first light emitting unit 501, the second light emitting unit 502 and the third light emitting unit 503 of each set of light emitting units are sequentially arranged in a direction perpendicular to the substrate.

In an exemplary embodiment of the present invention, after assembling the substrate 10 with the transparent substrate 20 together, the second light emitting unit 502 and the third light emitting unit 503 are disposed in the same or different layers in a thickness direction between the transparent substrate 20 and the substrate 10. In another exemplary embodiment of the present invention, after assembling the substrate 10 with the transparent substrate 20 together, the first and second light emitting units are disposed on the first side of the transparent substrate, and the third light emitting unit is disposed between the transparent substrate and the substrate.

Further, a packaging substrate 30 is further assembled after assembling the substrate 10 with the transparent substrate 20 together.

In another exemplary embodiment of the present invention, transparent resins 40 are filled in gaps among the plurality of spaced first light emitting units 501 when forming the plurality of first light emitting units 501. The transparent resins 40 are also filled in gaps between the plurality of spaced second light emitting units 502 when forming the plurality of second light emitting units 502. The transparent resins 40 are also filled in gaps between the plurality of spaced third light emitting units 503 when forming the plurality of third light emitting units 503. The transparent resins 40 may be filled by injection process.

Thereafter, frame sealing adhesives 70 may be applied between the substrate 10 and the transparent substrate 20 as well as between the transparent substrate 20 and the packaging substrate 30 to complete an assembly of the OLED display panel.

It is noted that a process of forming the plurality of space second light emitting units 502 on the transparent substrate 20 or the substrate 10 may include the following three cases: forming the second light emitting units 502 on the transparent substrate 20 and positioning the second light emitting units 502 and the first light emitting units 501 on the same side of the transparent substrate 20; or forming the second light emitting units 502 on the transparent substrate 20 and positioning the second light emitting units 502 and the first light emitting units 501 on different sides of the transparent substrate 20; or forming the second light emitting units 502 on the substrate 10 and positioning the second light emitting units 502 and the third light emitting units 503 on the same side of the substrate 10.

Referring to FIG. 4, the plurality of spaced second light emitting units 502 are formed on the one side of the transparent substrate 20 close to the substrate 10.

A process of manufacturing the light emitting units will be described below taking a process of forming the first light emitting unit 501 as an example. Referring to FIG. 5, the process specifically comprises steps of:

S01: forming a metal layer on the upper surface of the transparent substrate 20 by a vacuum thermal evaporation deposition process and patterning the metal layer by exposing, developing, etching and stripping by a single mask, thereby forming the metal reflecting electrode.

Here, a material of the metal layer may be one of aluminum, copper, silver and the like.

S02: forming the polymer conductive layer on a surface of the substrate on which the metal reflecting electrode has been formed by the vacuum thermal evaporation deposition process.

Here, the polymer conductive layer may be an organic polymer such as polyaniline acenaphthylene S03: forming the polymer emitting layer on a surface of the substrate on which the conductive layer has been formed by the vacuum thermal evaporation deposition process.

Here, the polymer emitting layer may be an organic polymer such as polyfluorene acenaphthene.

S04: forming the transparent ITO electrode on a surface of the substrate on which the emitting layer has been formed by the vacuum thermal evaporation deposition process.

The first light emitting unit 501 may be formed on the upper surface of the transparent substrate 20 by the steps as described above. The metal reflecting electrode, the conductive layer, the emitting layer and the transparent ITO electrode are flushed with each other at one end of the first light emitting unit 501. At the other end of the first light emitting unit 501, the conductive layer is provided to wrap the metal reflecting electrode, the emitting layer is provided to wrap the conductive layer, the transparent ITO electrode is provided to wrap the emitting layer, and all the metal reflecting electrode, the conductive layer, the emitting layer and the transparent ITO electrode are in contact with the upper surface of the transparent substrate 20.

Processes of manufacturing the second light emitting unit 502 and the third light emitting unit 503 are the same as that of the first light emitting unit 501, and are only adjusted according to the actual structure, and the description thereof in details are omitted herein.

Referring to FIG. 7, the method may further comprise a step of forming a support structure 60 on the substrate 10. After assembling the substrate 10 and the transparent substrate 20 together, the support structure 60 is positioned between the substrate 10 and the transparent substrate 20, and is aligned with the first light emitting unit 501 in a thickness direction. Specifically, the method may further comprise steps of: forming the support structure 60 on the same side of the substrate 10 as the third light emitting unit 503; and assembling the substrate 10 and the transparent substrate 20, so that the first light emitting unit 501 is positioned on one side of the transparent substrate 20 facing away from the substrate 10, and the third light emitting unit 503 and the support structure 60 are positioned on one side of the substrate 10 close to the transparent substrate 20. The support structure 60 is formed at a position corresponding to the first light emitting unit 501. A surface of the support structure 60 is coated with a material having light reflecting characteristic.

Although several exemplary embodiments have been shown and described above, the present invention is not limited herein, and it would be appreciated by those skilled in the art that various changes or modifications may be made in these embodiments without departing from the principle and spirit of the disclosure, the scope of which is defined in the claims and their equivalents.

What is claimed is:

1. An OLED display panel, comprising
   a substrate;
   a light emitting structure including a plurality of sets of light emitting units sequentially arranged on the substrate side by side, each set of light emitting units including a first light emitting unit, a second light emitting unit and a third light emitting unit,
   and in each set of light emitting units, at least two of the first, second and third light emitting units being located in different layers;
   a transparent substrate disposed above the substrate, the second and third light emitting units being disposed between the substrate and the transparent substrate; and
   a plurality of support structures disposed between the substrate and the transparent substrate and being in contact with both the substrate and the transparent substrate,
   wherein the plurality of support structure are disposed to be aligned with the first light emitting units in a thickness direction, respectively, and
   wherein surfaces of the support structures are covered with a material having light reflecting characteristic.

2. The OLED display panel according to claim 1, further comprising a transparent substrate disposed above the substrate,
   wherein the second and third light emitting units are disposed between the substrate and the transparent substrate.

3. The OLED display panel according to claim 2, wherein the second light emitting unit and the third light emitting unit are disposed in the same layer in a thickness direction between the transparent substrate and the substrate.

4. The OLED display panel according to claim 2, wherein the second light emitting unit and the third light emitting unit is disposed in a different layer in a thickness direction between the transparent substrate and the substrate.

5. The OLED display panel according to claim 1, wherein the support structure has a truncated pyramid structure; and
   an area of a surface of the support structure contacting with the transparent substrate is smaller than that of a surface of the support structures contacting with the substrate.

6. The OLED display panel according to claim 1, wherein each the light emitting unit has a main light emitting region and a dim region located around the main light emitting region,
   wherein the dim regions of any two adjacent light emitting units located in different layers are overlapped with each other.

7. The OLED display panel according to claim 1, wherein in the plurality of sets of light emitting units, gaps between the adjacent first light emitting units, between the adjacent second light emitting units, and between the adjacent third light emitting units are filled with transparent resins, respectively.

8. A display apparatus, comprising
   the OLED display panel according to claim 1; and
   a driving device configured to drive the first light emitting unit, the second light emitting unit and the third light emitting unit to emit lights, respectively.

9. The display apparatus according to claim 8, wherein the second light emitting unit and the third light emitting unit are disposed in the same layer in a thickness direction between the transparent substrate and the substrate.

10. The display apparatus according to claim 8, wherein the second light emitting unit and the third light emitting unit is disposed in a different layer in a thickness direction between the transparent substrate and the substrate.

11. A method for manufacturing an OLED display panel, comprising
    providing a transparent substrate and a substrate;
    forming a plurality of spaced first light emitting units on a first side of the transparent substrate;
    forming a plurality of spaced second light emitting units a second side of the transparent substrate, or the substrate;
    forming a plurality of spaced third light emitting units on the substrate;
    forming a plurality of support structure on the second side of the transparent substrate, or the substrate;
    covering surfaces of the support structures with a material having light reflecting characteristic; and
    assembling the substrate with the transparent substrate together, so that the first light emitting units are located on one side of the transparent substrate facing away from the substrate;
    the second light emitting units and the third light emitting units are located between the substrate and the transparent substrate;
    the first light emitting unit, the second light emitting unit and the third light emitting unit of each set of light emitting units are sequentially arranged in a direction parallel to the substrate; and
    the support structures are in contact with both the substrate and the transparent substrate, and disposed to be aligned with the first light emitting units in a thickness direction, respectively.

* * * * *